United States Patent
Jin (10) Patent No.: US 7,196,966 B2
(45) Date of Patent: Mar. 27, 2007

(54) ON DIE TERMINATION MODE TRANSFER CIRCUIT IN SEMICONDUCTOR MEMORY DEVICE AND ITS METHOD

(75) Inventor: Seung-Eon Jin, Ichon-shi (KR)

(73) Assignee: Hynix Semiconductor Inc. (KR)

(*) Notice: Subject to any disclaimer, the term of this patent is extended or adjusted under 35 U.S.C. 154(b) by 33 days.

(21) Appl. No.: 10/879,650

(22) Filed: Jun. 28, 2004

(65) Prior Publication Data

US 2005/0180229 A1 Aug. 18, 2005

(30) Foreign Application Priority Data

Feb. 13, 2004 (KR) .................... 10-2004-0009501

(51) Int. Cl.
*G11C 8/00* (2006.01)

(52) U.S. Cl. ...................... 365/233; 365/229
(58) Field of Classification Search ............... 365/233, 365/229
See application file for complete search history.

(56) References Cited

U.S. PATENT DOCUMENTS

| | | | |
|---|---|---|---|
| 5,134,587 A | 7/1992 | Steele | |
| 5,706,232 A | 1/1998 | McClure et al. | |
| 6,650,594 B1* | 11/2003 | Lee et al. | 365/233 |
| 6,699,734 B2 | 3/2004 | Schoenfeld et al. | |
| 2003/0235107 A1* | 12/2003 | Jang | 365/233 |
| 2004/0080322 A1 | 4/2004 | Braun et al. | |
| 2004/0100837 A1 | 5/2004 | Lee | |
| 2004/0141391 A1* | 7/2004 | Lee et al. | 365/200 |

* cited by examiner

*Primary Examiner*—Huan Hoang
*Assistant Examiner*—Kretelia Graham
(74) *Attorney, Agent, or Firm*—Blakely Sokoloff Taylor & Zafman (57) ABSTRACT

An on die termination (ODT) mode transfer circuit, for use in a semiconductor memory device, including: a delay locked loop (DLL) for receiving an external clock signal in order to generate a DLL clock signal according to a power down mode and an active-standby mode; an ODT mode signal generation means for generating an ODT mode signal in response to the DLL clock signal and a clock enable signal; and an ODT control means for generating a termination resistor (RTT) signal in response to an ODT signal and the ODT mode signal.

18 Claims, 9 Drawing Sheets

ON DIE TERMINATION MODE TRANSFER CIRCUIT IN SEMICONDUCTOR MEMORY DEVICE AND ITS METHOD

FIELD OF INVENTION

The present invention relates to an on die termination (ODT) technology; and, more particularly, to an ODT technology capable of properly operating an ODT circuit by shifting a mode conversion until an output clock signal of a delay locked loop (DLL) is stabilized after a power down exit, in case when a semiconductor memory device converts an operation mode from a power down mode to an active-standby mode.

DESCRIPTION OF PRIOR ART

On die termination (ODT) technology is introduced to improve signal integrity by minimizing signal reflection in an interface between a system and a semiconductor memory device, which are based on stub series termination logic (SSTL) II. Due to the introduction of the ODT technology, a termination voltage (VTT) and a termination resistor (RTT) can be provided by a semiconductor memory device and a memory controller in a double data rate-II synchronous dynamic random access memory (DDR-II SDRAM), instead of a motherboard.

The termination technology is described below in detail.

It is assumed that there are two ranks on a memory module. When the memory controller reads out data from a DRAM of a first rank, the memory controller applies an ODT signal of a logic high level to the DRAM of a second rank. At this time, the DRAM of the second rank forms a termination on a data bus which is shared with the first rank. This is called 'termination resistor (RTT) formation'.

Figure 1:
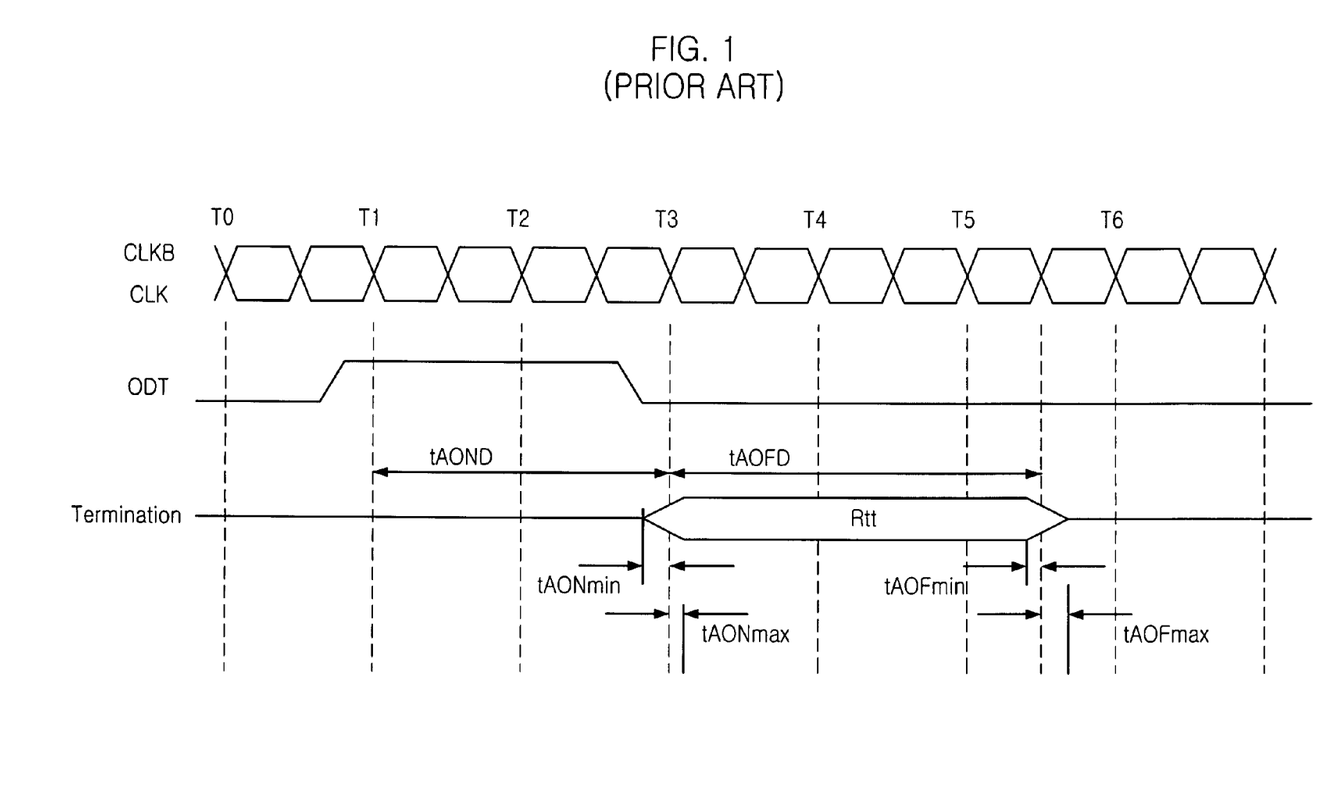
FIG. 1 is a timing diagram showing an operation of an on die termination (ODT) in an active-standby mode according to the prior art.
Figure 2:
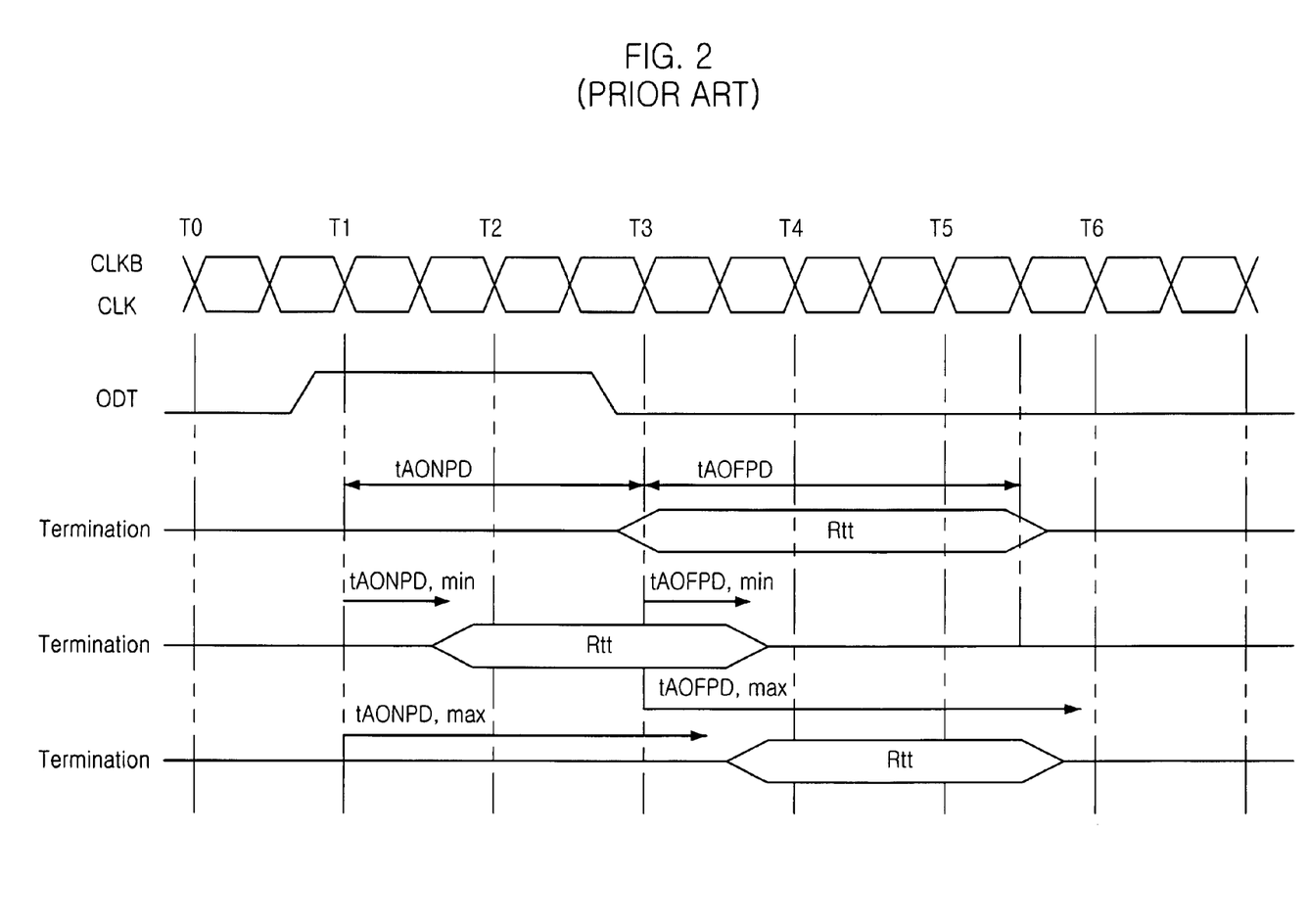
FIG. 2 is a timing diagram showing an operation of an ODT in a power down mode according to the prior art.

FIG. 1 is a timing diagram showing an operation of the ODT in an active-standby mode according to the prior art, and FIG. 2 is a timing diagram showing an operation of the ODT in the power down mode according to the prior art.

Referring to FIGS. 1 and 2, whether DRAM is in the active-standby mode or the power down mode is determined depending on a starting point of the RTT formation generated in response to the ODT signal.

In the active-standby mode, the ODT circuit provides the ODT signal which changes from a logic low level to a logic high level in synchronization with a rising edge or a falling edge of a clock signal outputted from a delay locked loop (DLL). Thereafter, an external data bus is terminated by the RTT formation in synchronization with a rising edge of an external clock signal CLK after a delay time as much as two clock cycles of the external clock signal CLK. The delay time is called an ODT turn-on delay time (tAOND).

When the ODT circuit provides the ODT signal which changes from a logic high level to a logic low level, the RTT becomes turned-off in synchronization with a falling edge of the external clock signal CLK after a delay time as much as 2.5 clock cycles. The delay time is called an ODT turn-off delay time (tAOFD).

Meanwhile, there are two kinds of the power down mode in the DRAM.

When a clock enable signal CKE of a logic low level is applied, and, thus, the DRAM enters the power down mode, if a certain signal for performing a read operation or a write operation is accessed to any one of banks in the DRAM, the DRAM enters the power down mode from an active mode. This is called an active power down mode.

On the other hand, if there is no signal access to the any bank of the DRAM, the DRAM enters the power down mode from a precharge mode. This is called a precharge power down mode.

In the power down mode, the DLL is turned-off, and particularly in the precharge power down mode, even clock signals inputted to a delay unit of the DLL are gated off in order to reduce power consumption of the DRAM, and the DLL is not operated and just maintains a previous locking information.

Accordingly, in the precharge power down mode, the output signal of the DLL which is necessary for forming the RTT in the DRAM cannot be used. Therefore, there is required that the minimum value and the maximum value of a power down turn-on time tAONPD and a power down turn-off time tAOFPD have to secure larger margin than that of the ODT turn-on delay time tAOND and the ODT turn-off delay time tAOFD.

Figure 3:
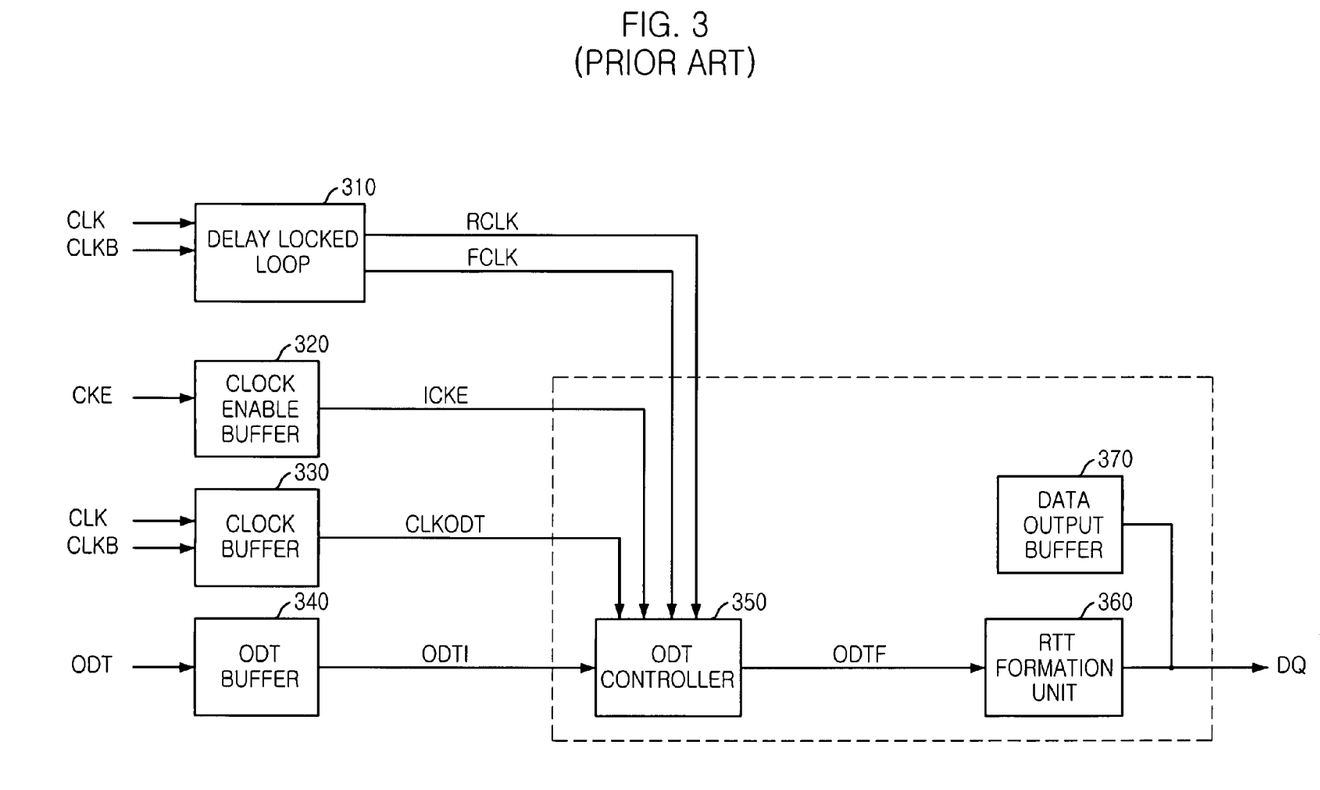
FIG. 3 is block diagram showing a conventional ODT operation unit.

FIG. 3 is block diagram showing a conventional ODT operation unit.

As shown, the conventional ODT operation unit includes a delay locked loop (DLL) 310, a clock enable buffer 320, a clock buffer 330, an ODT buffer 340, an ODT controller 350, an RTT formation unit 360 and a data output buffer 370.

The DLL 310 receives the external clock signal CLK and an external clock bar signal CLKB to generate a rising clock signal RCLK and a falling clock signal FCLK.

The clock enable buffer 320 receives the clock enable signal CKE for buffering the clock enable signal CKE and outputs the buffered signals as a buffered clock enable signal ICKE.

The clock buffer 330 receives the external clock signal CLK and the external clock bar signal CLKB to generate an ODT control clock signal CLKODT for controlling the ODT controller 350.

The ODT buffer 340 compares an ODT signal ODT with a reference voltage to output an ODT comparison signal ODTI. The ODT controller 350 receives the buffered clock enable signal ICKE, the ODT control clock signal CLKODT, the ODT comparison signal ODTI, the rising clock signal RCLK and the falling clock signal FCLK to generate an RTT formation control signal ODTF.

The RTT formation unit 360 turns on/off the RTT in response to the RTT formation control signal ODTF, and the data output buffer 370 provides data on a data bus through a combination with an output signal of the RTT formation unit 360.

Figure 4:
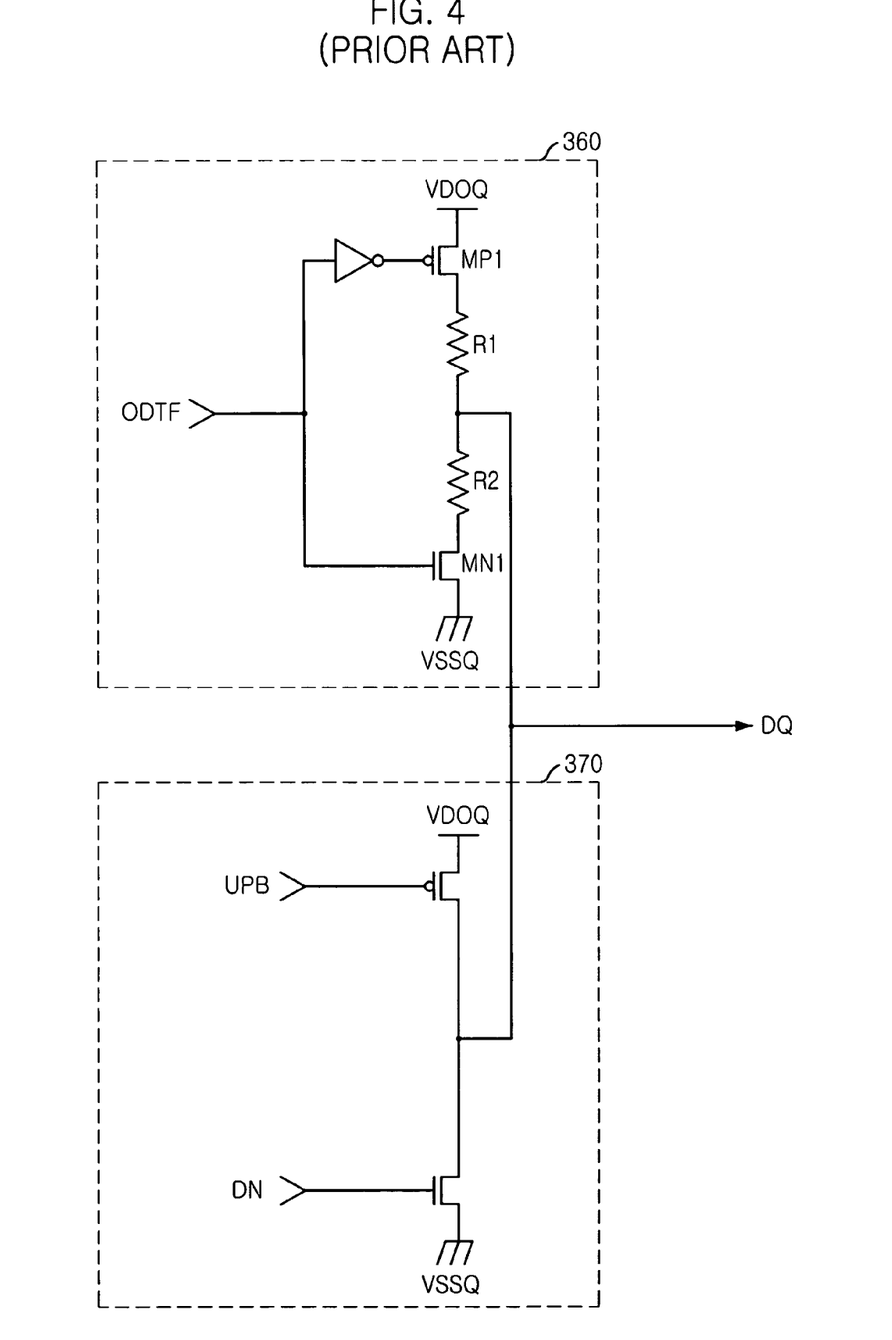
FIG. 4 is a schematic circuit diagram showing an RTT formation unit and a data output buffer shown in FIG. 3.

FIG. 4 is a schematic circuit diagram showing the RTT formation unit 360 and the data output buffer 370.

If the RTT formation control signal ODTF which changes from a logic low level to a logic high level is inputted to the RTT formation unit 360, a p-channel metal oxide semiconductor (PMOS) transistor MP1 connected to a power supply voltage VDDQ and an n-channel metal oxide semiconductor (NMOS) transistor MN1 connected to a ground voltage VSSQ are turned on. Therefore, an output signal of the RTT formation unit 360 is terminated by division of resistors R1 and R2. This is called 'ODT turn on'. Herein, the resistor R1 and R2 are connected in series between the PMOS transistor MP1 and the NMOS transistor MN1.

On the other hand, if the RTT formation control signal ODTF which changes from a logic high level to a logic low level is inputted to the RTT formation unit 360, the PMOS transistor MP1 and the NMOS transistor MN1 are turned off. Therefore, the turned-on termination becomes turned off. This is called 'ODT turn off'.

Generally, output signals of the RTT formation unit 360 and the data output buffer 370 are commonly coupled to be connected to a data output pin (DQ pin).

Figure 5:
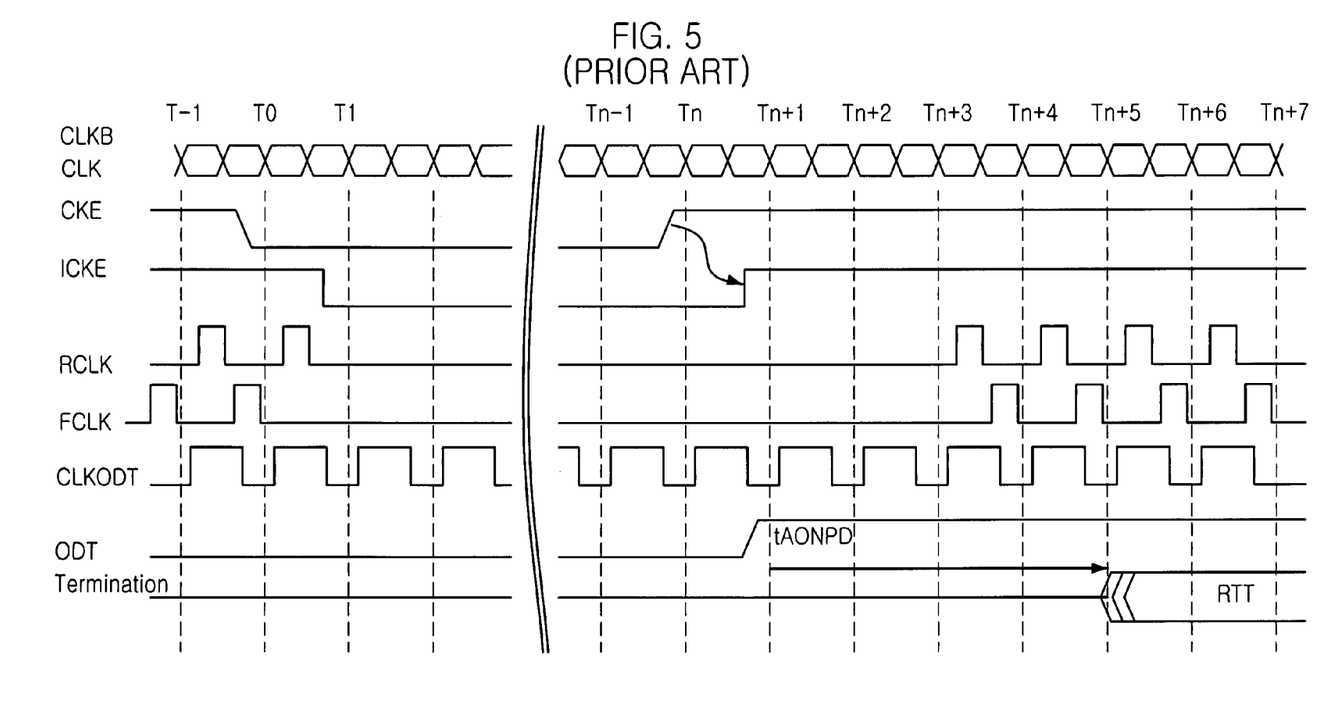
FIG. 5 is a timing diagram showing an operation of an ODT controller shown in FIG. 3.

FIG. 5 is a timing diagram showing an operation of the ODT controller 350.

When the clock enable signal CKE is changed from a logic low level to a logic high level at the power down mode, the ODT controller 350 becomes in the active-standby mode.

Herein, at the precharge power down mode, the DLL 310 is disabled and is not operated. Even though the DLL 310 is enabled again when the precharge power down mode is terminated, the DLL 310 can not be operated normally at the same time when the clock enable signal CKE is changed from a logic low level to a logic high level. That is, the DLL 310 requires a predetermined set up time to be operated normally after the DLL 310 is enabled.

Therefore, the RTT may be generated abnormally since clock signals generated by the DLL 310 are not generated when the precharge power down mode is terminated.

SUMMARY OF INVENTION

It is, therefore, an object of the present invention to provide an on die termination (ODT) mode transfer circuit which performs an ODT operation stably.

In accordance with an aspect of the present invention, there is provided an ODT mode transfer circuit, for use in a semiconductor memory device, including: a delay locked loop (DLL) for receiving an external clock signal in order to generate a DLL clock signal according to a power down mode and an active-standby mode; an ODT mode signal generation means for generating an ODT mode signal in response to the DLL clock signal and a clock enable signal; and an ODT control means for generating a termination resistor (RTT) signal in response to an ODT signal and the ODT mode signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an on die termination (ODT) mode transfer circuit for use in a semiconductor memory device in accordance with a preferred embodiment of the present invention will be described in detail referring to the accompanying drawings.

Figure 6:
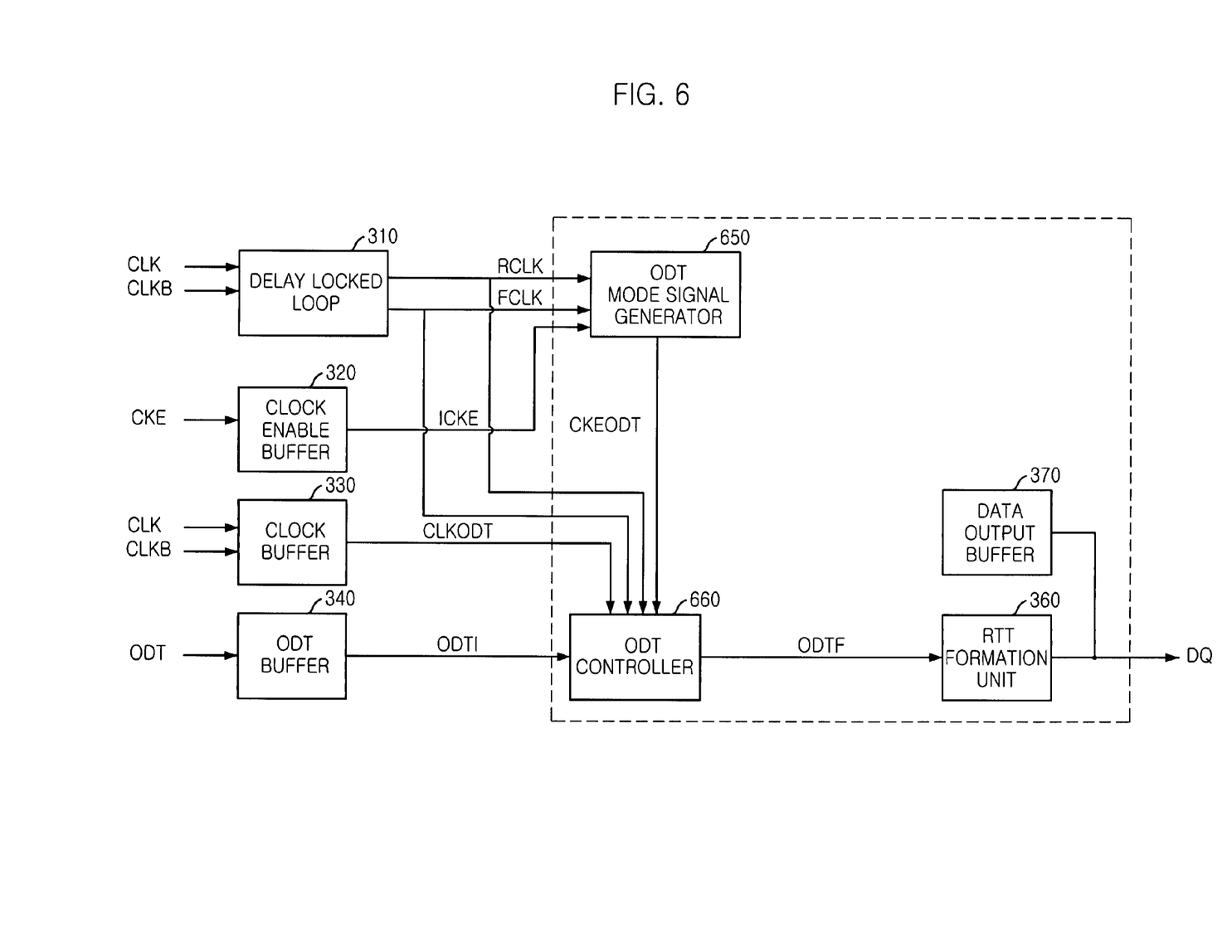
FIG. 6 is a block diagram showing an ODT mode transfer circuit in accordance with a preferred embodiment of the present invention.

FIG. 6 is a block diagram showing an ODT mode transfer circuit in accordance with a preferred embodiment of the present invention.

As shown, the ODT mode transfer circuit includes a delay locked loop (DLL) 310, a clock enable buffer 320, a clock buffer 330, an ODT buffer 340, an ODT mode signal generator 650, an ODT controller 660, an RTT formation unit 360 and a data output buffer.

The DLL 310 receives an external clock signal CLK and an external clock bar signal CLKB in order to generate a rising clock signal RCLK and a falling clock signal FCLK.

The clock enable buffer 320 buffers a clock enable signal CKE for outputting the buffered signal as a buffed clock enable signal ICKE.

The clock buffer 330 receives the external clock signal CLK and the external clock bar signal CLKB to generate an ODT control clock signal CLKODT for controlling the ODT controller 660.

The ODT buffer 340 compares an ODT signal ODT with a reference voltage in order to output an ODT comparison signal ODTI.

The ODT mode signal generator 650 receives the rising clock signal RCLK, the falling clock signal FCLK and the buffered clock enable signal ICKE for generating an ODT mode signal CKEODT. The ODT mode signal generator 650 converts an ODT mode from a power down mode to an active-standby mode when the rising clock signal RCLK and the falling clock signal FCLK are stably generated by the DLL 310 after a power down mode exit.

The ODT controller 660 receives the rising clock signal RCLK, the falling clock signal FCLK, the ODT control clock signal CLKODT, the buffered clock enable signal ICKE, the ODT comparison signal ODTI and the ODT mode signal CKEODT in order to generate an RTT formation control signal ODTF for controlling the RTT formation unit 360.

The RTT formation unit 360 turns on/off a termination resistor (RTT) in response to the RTT formation control signal ODTF, and the data output buffer 370 provides data into a data bus through a combination with an output signal of the RTT formation unit 360.

Figure 7:
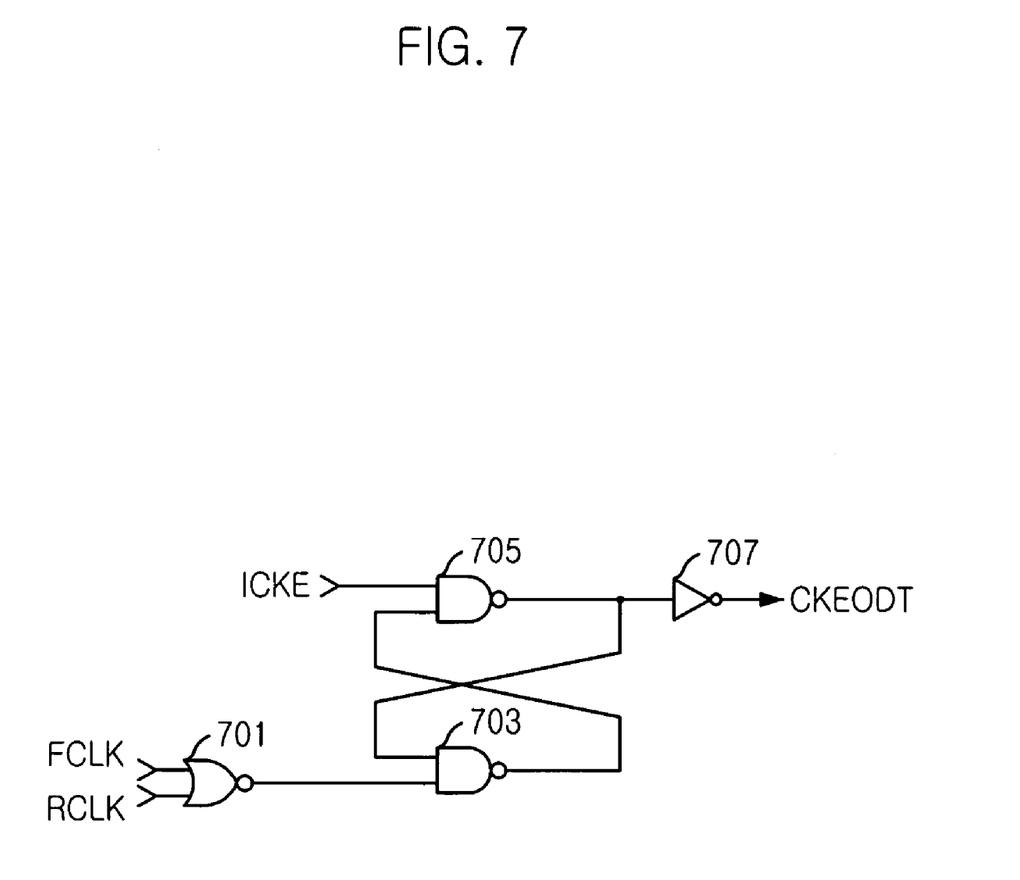
FIG. 7 is a schematic circuit diagram depicting an ODT mode signal generator shown in FIG. 6.

FIG. 7 is a schematic circuit diagram depicting the ODT mode signal generator 650 shown in FIG. 6.

As shown, the ODT mode signal generator 650 includes a NOR gate 701, a first NAND gate 703, a second NAND gate 705 and a first inverter 707.

The NOR gate 701 performs a logic NOR operation to the rising clock signal RCLK and the falling clock signal FCLK and outputs the result of the logic NOR operation to the first NAND gate 703.

The first and the second NAND gate 703 and 705 forms a latch unit for latching and outputting the buffered clock enable signal ICKE.

The first inverter 707 inverts an output signal of the second NAND gate 705 in order to output the inverted signal as the ODT mode signal CKEODT.

Figure 8:
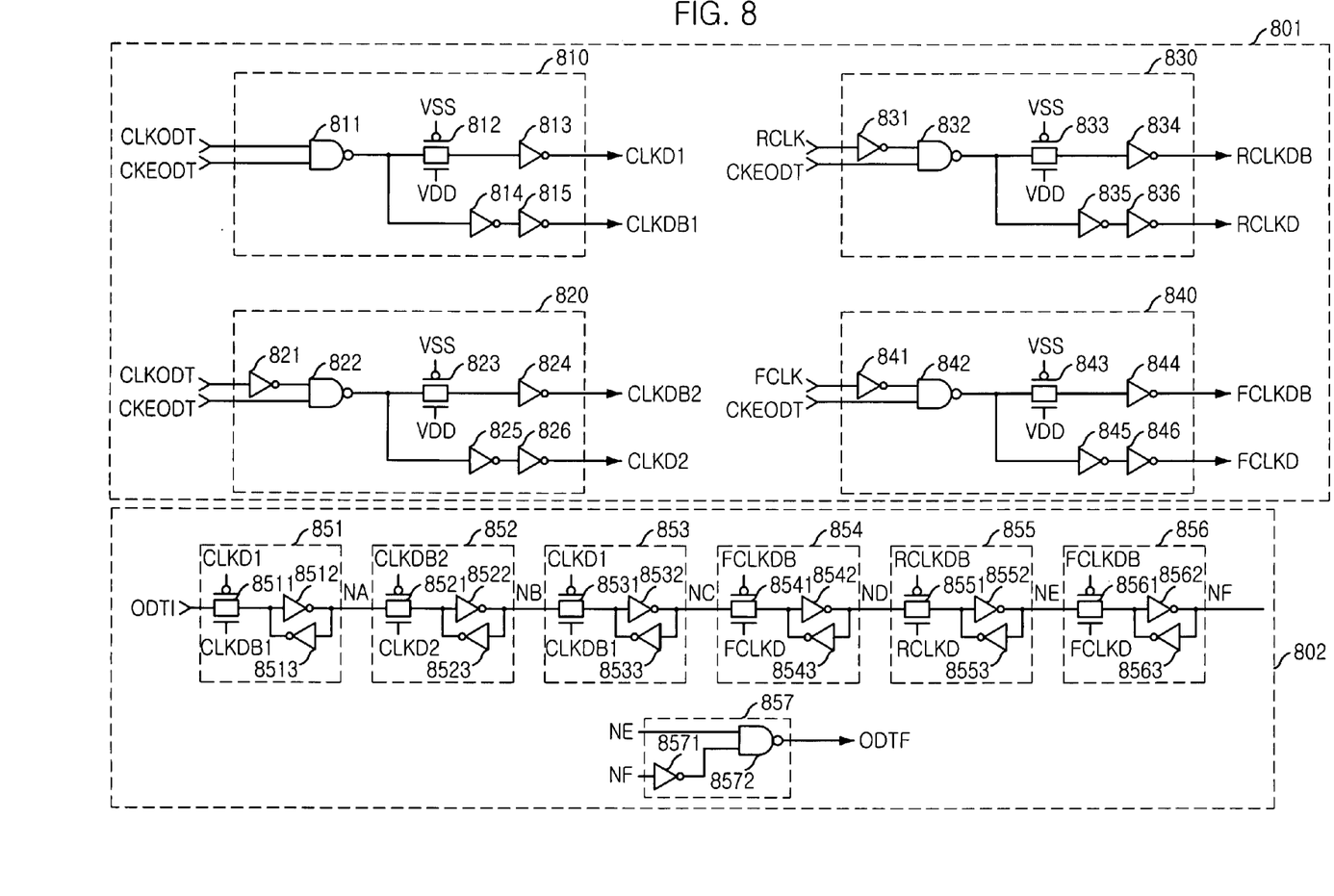
FIG. 8 is a schematic circuit diagram showing an ODT controller shown in FIG. 6.

FIG. 8 is a schematic circuit diagram showing the ODT controller 660 shown in FIG. 6.

As shown, the ODT controller 660 includes an internal control signal generation unit 801 and an RTT formation control signal generation unit 802.

The ODT controller 660 receives the ODT control clock signal CLKODT, the ODT mode signal CKEODT and the rising and the falling clock signals RCLK and FCLK for generating a plurality of internal control signals. Herein, the plurality of internal control signals includes a first internal control signal CLKD1 and its inverted signal, i.e., a first internal control bar signal CLKDB1; a second internal control signal CLKD2 and its inverted signal, i.e., a second internal control bar signal CLKDB2; a third internal control signal RCLKD and its inverted signal, i.e., a third internal control bar signal RCLKDB; and, a fourth internal control signal FCLKD and its inverted signal, i.e., a fourth internal control bar signal FCLKDB.

The RTT formation control signal generation unit 802 receives the plurality of internal control signals in order to generate the RTT formation control signal ODTF in response to the ODT comparison signal ODTI.

In detail, the internal control signal generation unit 801 includes a first to a fourth unit internal control signal generator 810 to 840.

The first unit internal control signal generator 810 includes a third NAND gate 811, a first transfer gate 812, a second to a fourth inverters 813 to 815.

The third NAND gate 811 performs a logic NAND operation to the ODT control clock signal CLKODT and the ODT mode signal CKEODT and outputs the result of the logic NAND operation to the first transfer gate 812 and the third inverter 814. The first transfer gate 812 transfers an output signal of the third NAND gate 811 to the second inverter 813, and the second inverter 813 buffers an output signal of the first transfer gate 812 in order to output the buffered signal as the first internal control signal CLKD1. The third and the fourth inverters 814 and 815 buffer the output signal of the third NAND gate 811 in order to output the buffered signal as the first internal control bar signal CLKDB1.

Similarly, the second unit internal control signal generator 820 includes a fifth inverter 821, a fourth NAND gate 822, a second transfer gate 823, a sixth to an eighth inverters 824 to 826.

The fifth inverter 821 buffers the ODT control clock signal CLKODT for outputting the buffered signal to the fourth NAND gate 822. The fourth NAND gate 822 performs a logic NAND operation to an output signal of the fifth inverter 821 and the ODT mode signal CKEODT in order to output the result of the logic NAND operation to the second transfer gate 823 and the seventh inverter 825. The second transfer gate 823 transfers an output signal of the fourth NAND gate 822 to the sixth inverter 824, and the sixth inverter 824 buffers an output signal of the second transfer gate 823 in order to output the buffered signal as the second internal control bar signal CLKDB2. The seventh and the eighth inverters 825 and 826 buffer the output signal of the fourth NAND gate 822 in order to output the buffered signal as the second internal control signal CLKD2.

Likewise, the third unit internal control signal generator 830 includes a ninth inverter 831, a fifth NAND gate 832, a third transfer gate 833, a tenth to a twelfth inverters 834 to 836.

The ninth inverter 831 buffers the rising clock signal RCLK for outputting the buffered signal to the fifth NAND gate 832. The fifth NAND gate 832 performs a logic NAND operation to an output signal of the ninth inverter 831 and the ODT mode signal CKEODT in order to output the result of the logic NAND operation to the third transfer gate 833 and the eleventh inverter 835. The third transfer gate 833 transfers an output signal of the fifth NAND gate 832 to the tenth inverter 834, and the tenth inverter 834 buffers an output signal of the third transfer gate 833 in order to output the buffered signal as the third internal control bar signal RCLKDB. The eleventh and the twelfth inverters 835 and 836 buffer the output signal of the fifth NAND gate 832 in order to output the buffered signal as the third internal control signal RCLKD.

The fourth unit internal control signal generator 840 includes a thirteenth inverter 841, a sixth NAND gate 842, a fourth transfer gate 843, a fourteenth to a sixteenth inverters 844 to 846.

The thirteenth inverter 841 buffers the falling clock signal FCLK for outputting the buffered signal to the sixth NAND gate 842. The sixth NAND gate 842 performs a logic NAND operation to an output signal of the thirteenth inverter 841 and the ODT mode signal CKEODT in order to output the result of the logic NAND operation to the fourth transfer gate 843 and the fifteenth inverter 845. The fourth transfer gate 843 transfers an output signal of the thirteenth NAND gate 842 to the fourteenth inverter 844, and the fourteenth inverter 844 buffers an output signal of the fourth transfer gate 843 in order to output the buffered signal as the fourth internal control bar signal FCLKDB. The fifteenth and the sixteenth inverters 845 and 846 buffer the output signal of the sixth NAND gate 842 in order to output the buffered signal as the fourth internal control signal FCLKD.

The RTT formation control signal generation unit 802 includes a signal output unit 857 and a first to a sixth latch units 851 to 856.

The first latch unit 851 includes a fifth transfer gate 8511, a seventeenth and an eighteenth inverters 8512 and 8513. The fifth transfer gate 8511 transfers the ODT comparison signal ODTI to the seventeenth and the eighteenth inverters 8512 and 8513 when the first internal control signal CLKD1 is in a logic low level. The seventeenth and the eighteenth inverters 8512 and 8513 serve to latch an output signal of the fifth transfer gate 8511 in order to output the output signal of the fifth transfer gate 8511 to a first node NA.

The second latch unit 852 includes a sixth transfer gate 8521, a nineteenth and a twentieth inverters 8522 and 8523. The sixth transfer gate 8521 transfers an output signal of the first node NA to the nineteenth and the twentieth inverters 8522 and 8523 when the second internal control signal CLKD2 is in a logic high level. The nineteenth and the twentieth inverters 8522 and 8523 serve to latch an output signal of the sixth transfer gate 8521 in order to output the output signal of the sixth transfer gate 8521 to a second node NB.

The third latch unit 853 includes a seventh transfer gate 8531, a twenty first and a twenty second inverters 8532 and 8533. The seventh transfer gate 8531 transfers an output signal of the second node NB to the twenty first and the twenty second inverters 8532 and 8533 when the first internal control signal CLKD1 is in a logic low level. The twenty first and the twenty second inverters 8532 and 8533 serve to latch an output signal of the seventh transfer gate 8531 in order to output the output signal of the seventh transfer gate 8531 to a third node NC.

The fourth latch unit 854 includes an eighth transfer gate 8541, a twenty third and a twenty fourth inverters 8542 and 8543. The eighth transfer gate 8541 transfers an output signal of the third node NC to the twenty third and the twenty fourth inverters 8542 and 8543 when the fourth internal control signal FCLKD is in a logic high level. The twenty third and the twenty fourth inverters 8542 and 8543 serve to latch an output signal of the eighth transfer gate 8541 in order to output the output signal of the eighth transfer gate 8541 to a fourth node ND.

The fifth latch unit 855 includes a ninth transfer gate 8551, a twenty fifth and a twenty sixth inverters 8552 and 8553. The ninth transfer gate 8551 transfers an output signal of the fourth node ND to the twenty fifth and the twenty sixth inverters 8552 and 8553 when the third internal control signal RCLKD is in a logic high level. The twenty fifth and the twenty sixth inverters 8552 and 8553 serve to latch an output signal of the ninth transfer gate 8551 in order to output the output signal of the ninth transfer gate 8551 to a fifth node NE.

The sixth latch unit 856 includes a tenth transfer gate 8561, a twenty seventh and a twenty eighth inverters 8562 and 8563. The tenth transfer gate 8561 transfers an output signal of the fifth node NE to the twenty seventh and the twenty eighth inverters 8562 and 8563 when the fourth internal control signal FCLKD is in a logic high level. The twenty seventh and the twenty eighth inverters 8562 and 8563 serve to latch an output signal of the tenth transfer gate 8561 in order to output the output signal of the tenth transfer gate 8561 to a sixth node NF.

The signal output unit 857 includes a twenty ninth inverter 8571 and a seventh NAND gate 8572.

The twenty ninth inverter 8571 buffers an output signal of the sixth node NF to output the buffered signal to the seventh NAND gate 8572. The seventh NAND gate 8572 performs a logic NAND operation to an output signal of the twenty ninth inverter 8571 and the output signal of the fifth node NE to thereby output the result of the logic NAND operation as the RTT formation control signal ODTF.

Meanwhile, at an initial state, the first, the third and the fifth nodes NA, NC and NE are in a logic high level; and, the second, the fourth and the sixth nodes NB, ND and NF are in a logic low level.

Figure 9:
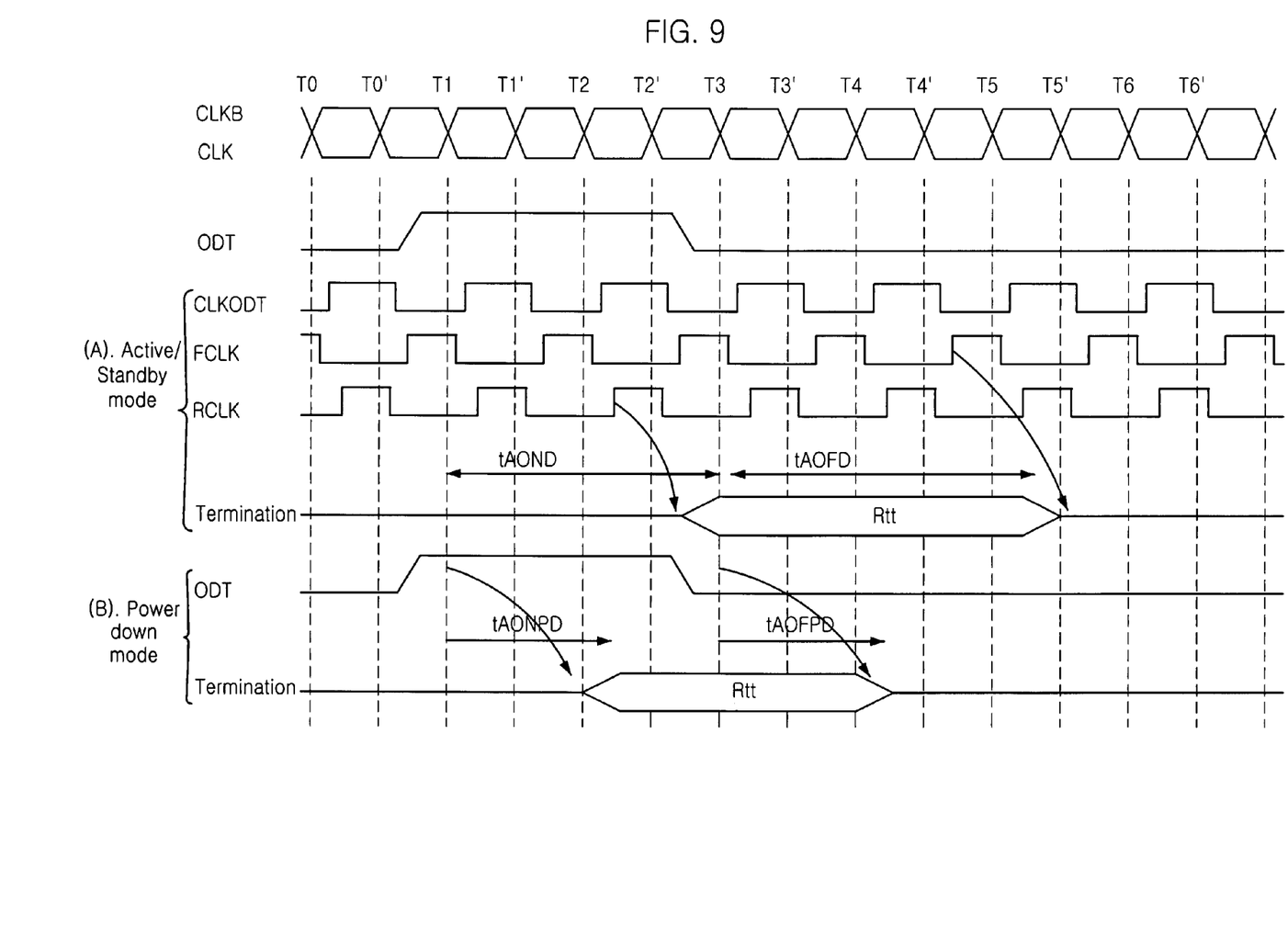
FIG. 9 is a timing diagram showing an operation of an ODT mode transfer circuit in accordance with the preferred embodiment of the present invention.

FIG. 9 is a timing diagram showing an operation of the ODT mode transfer circuit in accordance with the preferred embodiment of the present invention.

A section (A) shows the operation of the ODT mode transfer circuit at the active-standby mode. Referring to the section (A), the operation of the ODT mode transfer circuit is described below.

If the ODT signal ODT is activated as a logic high level at T1', the RTT is turned-on at T3 after 2 clock cycles of the external clock signal CLK, i.e., after an ODT turn-on delay time tAOND.

In detail, the ODT comparison signal ODTI is latched by the first latch unit 851 in response to a rising edge of the ODT control clock signal CLKODT at T1. Then, the ODT comparison signal ODTI latched by the first latch unit 851 is passed through the second latch unit 852 and becomes in a logic high level. Thereafter, the third node NC becomes in a logic low level in response to a falling edge of the ODT control clock signal CLKODT at T', and, the fourth node ND becomes in a logic high level in response to a rising edge of the falling clock signal FCLK between T1' and T2. Thereafter, the fifth node NE becomes in a logic low level in response to a rising edge of the rising clock signal RCLK, and, thus, the RTT formation control signal ODTF is activated as logic high level.

The section (B) shows the operation of the ODT mode transfer circuit at the power down mode. Referring to the section (B), the operation of the ODT mode transfer circuit is described below.

Since the buffered clock enable signal ICKE is in a logic low level at the power down mode, the first internal control signal CLKD1 is in a logic low level, the second internal control signal CLKD2 is in a logic high level, the third internal control signal RCLKD is in a logic high level and the fourth internal control signal FCLKD is in a logic high level. Then, the RTT formation control signal ODTF is activated based on the plurality of internal control signals. Therefore, at the power down mode, the ODT mode transfer circuit asynchronously generates the RTT formation control signal ODTF not using clock signals generated by the DLL 310, i.e., the rising clock signal RCLK and the falling clock signal FCLK.

Meanwhile, in case that the RTT is turned-off, if the ODT signal ODT becomes in a logic low level at T3, the RTT is turned-off after 2.5 clock cycles of the external clock signal CLK.

As described above, since the ODT mode transfer circuit does not use a DLL clock signal at the power down mode in order to generate the RTT formation control signal ODTF, the ODT mode transfer circuit can stably generate the RTT formation control signal ODTF when the power down mode is terminated.

The present application contains subject matter related to Korean patent application No. 2004-9501, filed in the Korean Patent Office on Feb. 13, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An on die termination (ODT) mode transfer circuit, for use in a semiconductor memory device, comprising:
   a delay locked loop (DLL) for receiving an external clock signal in order to generate a DLL clock signal according to a power down mode and an active-standby mode;
   an ODT mode signal generation means for generating an ODT mode signal in response to the DLL clock signal and a clock enable signal; and
   an ODT control means for receiving an ODT signal and generating a termination resistor (RTT) signal in response to the DLL clock signal and the ODT mode signal,
   wherein the RTT signal is generated synchronizing with the DLL clock signal at the active-standby mode or is generated not synchronizing with the DLL clock signal at the power down mode.

2. The ODT mode transfer circuit as recited in claim 1, further comprising a clock buffer for receiving the external clock signal in order to generate an ODT control clock signal for controlling the ODT control means.

3. The ODT mode transfer circuit as recited in claim 2, wherein the ODT mode signal generation means includes:
   a NOR gate for receiving the DLL clock signal;
   a latch unit for latching the clock enable signal; and
   an inverter for outputting an output signal of the latch unit as the ODT mode signal.

4. The ODT mode transfer circuit as recited in claim 2, wherein the ODT control means includes:
   an internal control signal generation unit which receives the ODT mode signal, the ODT control clock signal and the DLL clock signal for generating a plurality of internal control signals; and
   an RTT signal generation unit for generating the RTT signal in response to the ODT signal and the plurality of internal control signals.

5. The ODT mode transfer circuit as recited in claim 4, wherein the internal control signal generation unit includes:

a first unit control signal generator for generating a first internal control signal and a first internal control bar signal in response to the ODT mode signal and the ODT control clock signal;

a second unit control signal generator for generating a second internal control signal and a second internal control bar signal in response to the ODT mode signal and the ODT clock signal;

a third unit control signal generator for generating a third internal control signal and a third internal control bar signal in response to the ODT mode signal and the DLL clock signal; and a fourth unit control signal generator for generating a fourth internal control signal and a fourth internal control bar signal in response to the ODT mode signal and the DLL clock signal.

6. The ODT mode transfer circuit as recited in claim 5, wherein the first unit control signal generator includes:
   a NAND gate for receiving the ODT mode signal and the ODT clock signal;
   a transfer gate for transferring an output signal of the NAND gate;
   a first inverter which inverts an output signal of the transfer gate for generating the first internal control signal; and
   a plurality of inverters connected in series which receives the output signal of the NAND gate for generating the first internal control bar signal.

7. The ODT mode transfer circuit as recited in claim 5, wherein the second unit control signal generator includes:
   a first inverter for receiving the ODT clock signal;
   a NAND gate for receiving the ODT mode signal and an output signal of the first inverter;
   a transfer gate for transferring an output signal of the NAND gate;
   a second inverter which inverts an output signal of the transfer gate for generating the second internal control bar signal; and
   a plurality of inverters connected in series which receives the output signal of the NAND gate for generating the second internal control signal.

8. The ODT mode transfer circuit as recited in claim 5, wherein the third unit control signal generator includes:
   a first inverter for receiving the DLL clock signal;
   a NAND gate for receiving the ODT mode signal and an output signal of the first inverter;
   a transfer gate for transferring an output signal of the NAND gate;
   a second inverter which inverts an output signal of the transfer gate for generating the third internal control bar signal; and
   a plurality of inverters connected in series which receives the output signal of the NAND gate for generating the third internal control signal.

9. The ODT mode transfer circuit as recited in claim 5, wherein the fourth unit control signal generator includes:
   a first inverter for receiving the DLL clock signal;
   a NAND gate for receiving the ODT mode signal and an output signal of the first inverter;
   a transfer gate for transferring an output signal of the NAND gate;
   a second inverter which inverts an output signal of the transfer gate for generating the fourth internal control bar signal; and
   a plurality of inverters connected in series which receives the output signal of the NAND gate for generating the fourth internal control signal.

10. The ODT mode transfer circuit as recited in claim 5, wherein the RTT signal generation unit includes:
    a plurality of latch units connected in series for latching and outputting the ODT signal in response to the plurality of internal control signals; and
    a signal output unit which receives an output signal of the plurality of latch units for outputting the RTT signal.

11. The ODT mode transfer circuit as recited in claim 10, wherein a first latch unit of the plurality of latch units includes:
    a first transfer gate for transferring the ODT signal in response to the first internal control signal; and
    a first latch for latching an output signal of the first transfer gate.

12. The ODT mode transfer circuit as recited in claim 11, wherein a second latch unit of the plurality of latch units includes:
    a second transfer gate for transferring an output signal of the first latch unit in response to the second internal control signal; and
    a second latch for latching an output signal of the second transfer gate.

13. The ODT mode transfer circuit as recited in claim 12, wherein a third latch unit of the plurality of latch units includes:
    a third transfer gate for transferring an output signal of the second latch unit in response to the first internal control signal; and
    a third latch for latching an output signal of the third transfer gate.

14. The ODT mode transfer circuit as recited in claim 13, wherein a fourth latch unit of the plurality of latch units includes:
    a fourth transfer gate for transferring an output signal of the third latch unit in response to the fourth internal control signal; and
    a fourth latch for latching an output signal of the fourth transfer gate.

15. The ODT mode transfer circuit as recited in claim 14, wherein a fifth latch unit of the plurality of latch units includes:
    a fifth transfer gate for transferring an output signal of the fourth latch unit in response to the third internal control signal; and
    a fifth latch for latching an output signal of the fifth transfer gate.

16. The ODT mode transfer circuit as recited in claim 15, wherein a sixth latch unit of the plurality of latch units includes:
    a sixth transfer gate for transferring an output signal of the fifth latch unit in response to the fourth internal control signal; and
    a sixth latch for latching an output signal of the sixth transfer gate.

17. The ODT mode transfer circuit as recited in claim 16, wherein the signal output unit includes:
    an inverter which inverts an output signal of the sixth latch unit; and
    a NAND gate which receives an output signal of the inverter and the output signal of the fifth latch unit for outputting the RTT signal.

18. The ODT mode transfer circuit as recited in claim 1, further comprising a buffer for buffering an inputted ODT command to outputting the ODT signal to the ODT control means.

* * * * *

UNITED STATES PATENT AND TRADEMARK OFFICE
CERTIFICATE OF CORRECTION

PATENT NO.       : 7,196,966 B2                                    Page 1 of 1
APPLICATION NO.  : 10/879650
DATED            : March 27, 2007
INVENTOR(S)      : Jin It is certified that error appears in the above-identified patent and that said Letters Patent is hereby corrected as shown below:

In claim #5, column 9, line 4, please delete "control".

Signed and Sealed this

Seventh Day of August, 2007

JON W. DUDAS
*Director of the United States Patent and Trademark Office*